United States Patent
Tobias

(10) Patent No.: US 9,093,117 B2
(45) Date of Patent: Jul. 28, 2015

(54) GROUND FEATURE FOR DISK DRIVE HEAD SUSPENSION FLEXURES

(71) Applicant: Hutchinson Technology Incorporated, Hutchinson, MN (US)

(72) Inventor: Kyle T. Tobias, Hutchinson, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 74 days.

(21) Appl. No.: 13/848,544

(22) Filed: Mar. 21, 2013

(65) Prior Publication Data

US 2013/0248231 A1    Sep. 26, 2013

Related U.S. Application Data

(60) Provisional application No. 61/614,304, filed on Mar. 22, 2012.

(51) Int. Cl.
*H05K 1/03* (2006.01)
*G11B 21/16* (2006.01)
(Continued)

(52) U.S. Cl.
CPC .............. *G11B 21/16* (2013.01); *G11B 5/4853* (2013.01); *H05K 1/05* (2013.01); *H05K 3/0011* (2013.01); *H05K 3/421* (2013.01); *H05K 3/282* (2013.01); *Y10T 29/49124* (2015.01)

(58) Field of Classification Search
CPC ........ G11B 21/16; G11B 5/4853; H05K 1/05; H05K 3/0011; H05K 3/421; H05K 3/282; Y10T 29/49124
USPC .......................... 174/250, 255, 257, 261, 262; 360/245.4, 245.8, 245.9, 244.3, 245.3, 360/266.3
See application file for complete search history.

(56) References Cited

U.S. PATENT DOCUMENTS

| 4,168,214 A | 9/1979 | Fletcher et al. |
| 4,422,906 A | 12/1983 | Kobayashi |

(Continued)

FOREIGN PATENT DOCUMENTS

| JP | 11-186441 A | † 7/1999 |
| JP | 2000-106478 A | † 4/2000 |

(Continued)

OTHER PUBLICATIONS

Cheng, Yang-Tse, "Vapor deposited thin gold coatings for high temperature electrical contacts", Electrical Contacts, 1996, Joint with the 18th International Conference on Electrical Contacts, Proceedings of the Forty-Second IEEE Holm Conference, Sep. 16-20, 1996 (abstract only).

(Continued)

*Primary Examiner* — Hoa C Nguyen
(74) *Attorney, Agent, or Firm* — Faegre Baker Daniels LLC

(57) ABSTRACT

Various embodiments concern an electrical interconnect of a head suspension. The electrical interconnect can comprise a spring metal layer and a dielectric layer having an aperture with a portion of the spring metal layer being exposed through the dielectric layer within the aperture. The electrical interconnect can further comprise a trace layer disposed on the dielectric layer and extending into the aperture to connect with the spring metal layer. Part of the spring metal layer within the aperture may not be covered by the trace layer. The exposure of the spring metal layer through the aperture can be due to the width of the trace layer being less than the width of the aperture and/or the exposure can be due to expected misregistration. A polymer covercoat can be applied over the aperture to protect the trace layer from corrosion.

16 Claims, 4 Drawing Sheets

(51) Int. Cl.
  *H05K 1/05* (2006.01)
  *H05K 3/00* (2006.01)
  *H05K 3/42* (2006.01)
  *G11B 5/48* (2006.01)
  *H05K 3/28* (2006.01)

(56) References Cited

U.S. PATENT DOCUMENTS

| | | |
|---|---|---|
| 4,659,438 A | 4/1987 | Werner et al. |
| 5,320,272 A | 6/1994 | Melton et al. |
| 5,521,778 A | 5/1996 | Boutaghou et al. |
| 5,608,591 A | 3/1997 | Klaassen |
| 5,651,723 A | 7/1997 | Bjornard et al. |
| 5,657,186 A | 8/1997 | Kudo et al. |
| 5,666,717 A | 9/1997 | Matsumoto et al. |
| 5,694,270 A | 12/1997 | Katsuhide Sone et al. |
| 5,737,152 A | 4/1998 | Balakrishnan |
| 5,754,368 A | 5/1998 | Shiraishi et al. |
| 5,773,889 A | 6/1998 | Love et al. |
| 5,796,552 A | 8/1998 | Akin, Jr. et al. |
| 5,812,344 A | 9/1998 | Balakrishnan |
| 5,818,662 A | 10/1998 | Shum |
| 5,857,257 A | 1/1999 | Inaba |
| 5,862,010 A | 1/1999 | Simmons et al. |
| 5,898,544 A | 4/1999 | Krinke et al. |
| 5,914,834 A | 6/1999 | Gustafson |
| 5,995,328 A | 11/1999 | Balakrishnan |
| 5,995,329 A | 11/1999 | Shiraishi et al. |
| 6,046,887 A | 4/2000 | Uozumi et al. |
| 6,156,982 A | 12/2000 | Dawson |
| 6,215,622 B1 | 4/2001 | Ruiz et al. |
| 6,229,673 B1 | 5/2001 | Shinohara et al. |
| 6,249,404 B1 | 6/2001 | Doundakov et al. |
| 6,278,587 B1 | 8/2001 | Mei |
| 6,307,715 B1 | 10/2001 | Berding et al. |
| 6,330,132 B1 | 12/2001 | Honda |
| 6,349,017 B1 | 2/2002 | Schott |
| 6,459,549 B1 | 10/2002 | Tsuchiya et al. |
| 6,480,359 B1 | 11/2002 | Dunn et al. |
| 6,490,228 B2 | 12/2002 | Killam |
| 6,539,609 B2 | 4/2003 | Palmer et al. |
| 6,600,631 B1 | 7/2003 | Berding et al. |
| 6,647,621 B1 | 11/2003 | Roen et al. |
| 6,661,617 B1 | 12/2003 | Hipwell, Jr. et al. |
| 6,704,165 B2 | 3/2004 | Kube et al. |
| 6,735,052 B2 | 5/2004 | Dunn et al. |
| 6,762,913 B1 | 7/2004 | Even et al. |
| 6,797,888 B2 | 9/2004 | Ookawa et al. |
| 6,831,539 B1 | 12/2004 | Hipwell, Jr. et al. |
| 6,833,978 B2 | 12/2004 | Shum et al. |
| 6,841,737 B2 | 1/2005 | Komatsubara et al. |
| 6,856,075 B1 | 2/2005 | Houk et al. |
| 6,882,506 B2 | 4/2005 | Yamaoka et al. |
| 6,891,700 B2 | 5/2005 | Shiraishi et al. |
| 6,900,967 B1 | 5/2005 | Coon et al. |
| 6,942,817 B2 | 9/2005 | Yagi et al. |
| 6,950,288 B2 | 9/2005 | Yao et al. |
| 7,064,928 B2 | 6/2006 | Fu et al. |
| 7,079,357 B1 | 7/2006 | Kulangara et al. |
| 7,099,117 B1 | 8/2006 | Subrahmanyam et al. |
| 7,129,418 B2 | 10/2006 | Aonuma et al. |
| 7,142,395 B2 | 11/2006 | Swanson et al. |
| 7,158,348 B2 | 1/2007 | Erpelding et al. |
| 7,161,767 B2 | 1/2007 | Hernandez et al. |
| 7,177,119 B2 | 2/2007 | Bennin et al. |
| 7,218,481 B1 | 5/2007 | Bennin et al. |
| 7,307,817 B1 | 12/2007 | Mei |
| 7,322,241 B2 | 1/2008 | Kai |
| 7,382,582 B1 | 6/2008 | Cuevas |
| 7,384,531 B1 | 6/2008 | Peltoma et al. |
| 7,385,788 B2 | 6/2008 | Kubota et al. |
| 7,388,733 B2 | 6/2008 | Swanson et al. |
| 7,391,594 B2 | 6/2008 | Fu et al. |
| 7,403,357 B1 | 7/2008 | Williams |
| 7,417,830 B1 | 8/2008 | Kulangara |
| 7,459,835 B1 | 12/2008 | Mei et al. |
| 7,509,859 B2 | 3/2009 | Kai |
| 7,625,654 B2 | 12/2009 | Vyas et al. |
| 7,629,539 B2 * | 12/2009 | Ishii et al. ............... 174/254 |
| 7,649,254 B2 | 1/2010 | Graydon et al. |
| 7,697,237 B1 | 4/2010 | Danielson |
| 7,710,687 B1 | 5/2010 | Carlson et al. |
| 7,710,688 B1 | 5/2010 | Hentges et al. |
| 7,804,663 B2 | 9/2010 | Hirano et al. |
| 7,813,084 B1 * | 10/2010 | Hentges ............... 360/245.9 |
| 7,826,177 B1 | 11/2010 | Zhang et al. |
| 7,832,082 B1 | 11/2010 | Hentges et al. |
| 7,872,344 B2 | 1/2011 | Fjelstad et al. |
| 7,875,804 B1 | 1/2011 | Tronnes et al. |
| 7,914,926 B2 | 3/2011 | Kimura et al. |
| 7,929,252 B1 | 4/2011 | Hentges et al. |
| 8,144,430 B2 | 3/2012 | Hentges et al. |
| 8,149,542 B2 | 4/2012 | Ando |
| 8,174,797 B2 | 5/2012 | Iriuchijima |
| 8,199,441 B2 | 6/2012 | Nojima |
| 8,228,642 B1 | 7/2012 | Hahn et al. |
| 8,248,731 B2 | 8/2012 | Fuchino |
| 8,248,734 B2 | 8/2012 | Fuchino |
| 8,248,735 B2 | 8/2012 | Fujimoto et al. |
| 8,248,736 B2 | 8/2012 | Hanya et al. |
| 8,296,929 B2 | 10/2012 | Hentges et al. |
| 8,339,748 B2 | 12/2012 | Shum et al. |
| 8,553,364 B1 * | 10/2013 | Schreiber et al. ......... 360/245.9 |
| 8,634,166 B2 | 1/2014 | Ohnuki et al. |
| 2002/0075606 A1 | 6/2002 | Nishida et al. |
| 2002/0118492 A1 | 8/2002 | Watanabe et al. |
| 2003/0089520 A1 * | 5/2003 | Ooyabu et al. ............... 174/255 |
| 2003/0135985 A1 | 7/2003 | Yao et al. |
| 2004/0181932 A1 | 9/2004 | Yao et al. |
| 2004/0221447 A1 * | 11/2004 | Ishii et al. ............... 29/830 |
| 2004/0264056 A1 | 12/2004 | Jang et al. |
| 2005/0117257 A1 | 6/2005 | Thaveeprungsriporn et al. |
| 2006/0274452 A1 | 12/2006 | Arya |
| 2007/0041123 A1 | 2/2007 | Swanson et al. |
| 2007/0227769 A1 | 10/2007 | Brodsky et al. |
| 2008/0247131 A1 * | 10/2008 | Hitomi et al. ............... 361/685 |
| 2008/0273269 A1 | 11/2008 | Pro |
| 2009/0135523 A1 | 5/2009 | Nishiyama et al. |
| 2009/0176120 A1 | 7/2009 | Wang |
| 2009/0190263 A1 | 7/2009 | Miura et al. |
| 2009/0294740 A1 | 12/2009 | Kurtz et al. |
| 2010/0067151 A1 | 3/2010 | Okawara et al. |
| 2010/0073825 A1 | 3/2010 | Okawara |
| 2010/0097726 A1 | 4/2010 | Greminger et al. |
| 2010/0143743 A1 | 6/2010 | Yamasaki et al. |
| 2010/0177445 A1 | 7/2010 | Fuchino |
| 2010/0195252 A1 | 8/2010 | Kashima |
| 2010/0220414 A1 | 9/2010 | Klarqvist et al. |
| 2010/0246071 A1 | 9/2010 | Nojima et al. |
| 2010/0271735 A1 | 10/2010 | Schreiber |
| 2011/0013319 A1 | 1/2011 | Soga et al. |
| 2011/0228425 A1 | 9/2011 | Liu et al. |
| 2011/0242708 A1 | 10/2011 | Fuchino |
| 2011/0279929 A1 | 11/2011 | Kin |
| 2012/0002329 A1 | 1/2012 | Shum et al. |
| 2012/0113547 A1 | 5/2012 | Sugimoto |
| 2013/0248231 A1 | 9/2013 | Tobias |

FOREIGN PATENT DOCUMENTS

| | | |
|---|---|---|
| JP | 2001057039 A | 2/2001 |
| JP | 2001307442 A | 11/2001 |
| JP | 2002050140 A | 2/2002 |
| JP | 2004300489 A | 10/2004 |
| JP | 2007-115864 A † | 5/2007 |
| JP | 2007115864 A * | 10/2007 |
| JP | 2010-126768 A † | 6/2010 |

OTHER PUBLICATIONS

Fu, Yao, "Design of a Hybrid Magnetic and Piezoelectric Polymer Microactuator", a thesis submitted to Industrial Research Institute Swinburne (IRIS), Swinburne University of Technology, Hawthorn, Victoria, Australia, Dec. 2005.

(56) References Cited

OTHER PUBLICATIONS

Harris, N.R. et al., "A Multilayer Thick-film PZT Actuator for MEMs Applications", Sensors and Actuators A: Physical, vol. 132, No. 1, Nov. 8, 2006, pp. 311-316.

Jing, Yang, "Fabrication of piezoelectric ceramic micro-actuator and its reliability for hard disk drives", Ultrasonics, Ferroelectrics and Frequency Control, IEEE, vol. 51, No. 11, Nov. 2004, pp. 1470-1476 (abstract only).

Kon, Stanley et al., "Piezoresistive and Piezoelectric MEMS Strain Sensors for Vibration Detection", Sensors and Smart Structures Technologies for Civil, Mechanical, and Aerospace Systems 2007, Proc. of SPIE vol. 6529.

Li, Longqiu et al., "An experimental study of the dimple-gimbal interface in a hard disk drive", Microsyst Technol (2011) 17:863-868.

Pichonat, Tristan et al., "Recent developments in MEMS-based miniature fuel cells", Microsyst Technol (2007) 13:1671-1678.

Raeymaekers, B. et al., "Investigation of fretting wear at the dimple/gimbal interface in a hard disk drive suspension", Wear, vol. 268, Issues 11-12, May 12, 2010, pp. 1347-1353.

Raeymaekers, Bart et al., "Fretting Wear Between a Hollow Sphere and Flat Surface", Proceedings of the STLE/ASME International Joint Tribology Conference, Oct. 19-21, 2009, Memphis, TN USA, 4 pages.

Rajagopal, Indira et al., "Gold Plating of Critical Components for Space Applications: Challenges and Solutions", Gold Bull., 1992, 25(2), pp. 55-66.

Yoon, Wonseok et al., "Evaluation of coated metallic bipolar plates for polymer electrolyte membrane fuel cells", The Journal of Power Sources, vol. 179, No. 1, Apr. 15, 2008, pp. 265-273.

International Search Report and Written Opinion issued in PCT/US2013/033341, mailed Jun. 14, 2013, 9 pages.

\* cited by examiner
† cited by third party

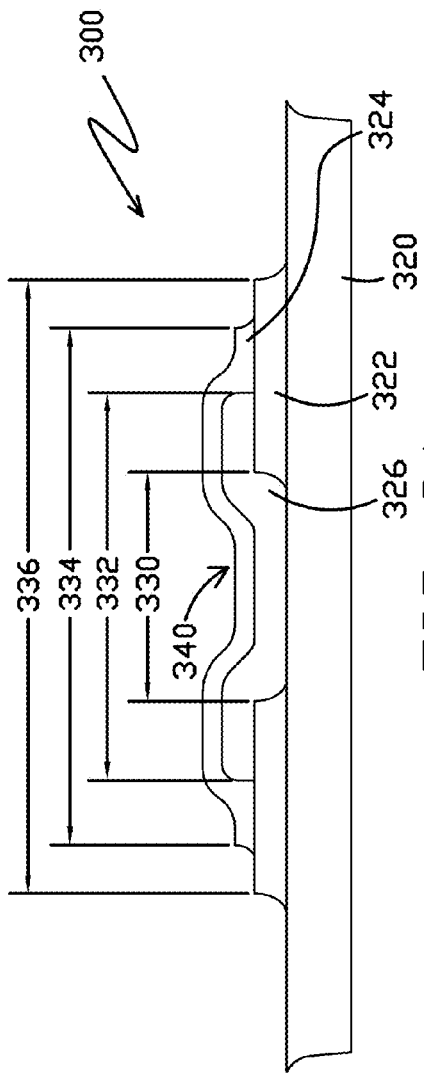
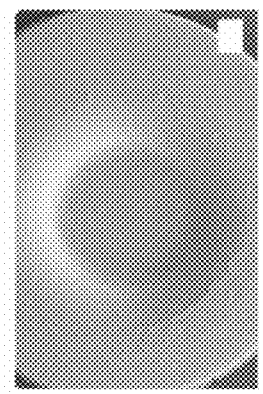
FIG. 3A
PRIOR ART
FIG. 3B
PRIOR ART

GROUND FEATURE FOR DISK DRIVE HEAD SUSPENSION FLEXURES

CROSS-REFERENCE TO RELATED APPLICATION

This application claims the benefit of U.S. Provisional Application Ser. No. 61/614,304 filed on Mar. 22, 2012 and entitled Plated Ground Feature Under Covercoat for Disk Drive Head Suspension Flexures, which is incorporated herein by reference for all purposes.

FIELD OF THE INVENTION

The invention relates generally to integrated lead or wireless flexures of the type incorporated into disk drive head suspensions.

BACKGROUND

Integrated lead or wireless suspensions and flexures (i.e., suspension components) are used to support read/write transducers in disk drives or other dynamic data storage systems. Flexures of type used in connection with disk drive head suspensions are generally known and commercially available. These devices typically include leads or traces formed in a copper or other conductive material layer over a stainless steel or other spring metal layer. A layer of dielectric insulating material such as polyimide separates the traces from the spring metal layer. The flexures are mounted to other components such as a stainless steel load beam in one embodiment of the invention. Subtractive and/or additive processes such as photolithography, wet and dry etching and deposition processes can be used to fabricate the flexures.

Plated ground features are often incorporated into disk drive head suspension flexures. These ground features are, for example, used to electrically interconnect the traces though apertures in the dielectric insulating layer to the underlying stainless steel layer. For example, they can be used to electrically interconnect so-called interleaved traces through the stainless steel layer. Ground features of these types and associated methods of manufacture are disclosed, for example, in the Tronnes U.S. Pat. No. 7,875,804 and the Peltoma U.S. Pat. No. 7,384,531.

The copper or other conductive material of the traces to which the ground features are connected are often plated with relatively non-corrosive materials such as NiAu (nickel-gold). NiAu does not, however, adhere well to stainless steel. A plated ground feature must therefore be large enough (e.g., in diameter) to cover the aperture through the insulating layer and the portion of the stainless steel layer exposed by that aperture. Furthermore, because of the need to accommodate layer-to-layer misregistration due to limitations inherent in the photolithography and deposition processes used to form ground features, the ground features are typically made even larger than the insulating layer apertures.

There remains, however, a continuing need for smaller ground features which can reduce the space taken up by the ground features to allow for other features to also be used and/or miniaturization of the assemblies.

BRIEF DESCRIPTION OF THE DRAWINGS

FIG. 3A is cross sectional view of a prior art interconnect of a head suspension.

FIG. 3B is an image taken by an electron microscope of a prior art interconnect.

SUMMARY

Figure 1:
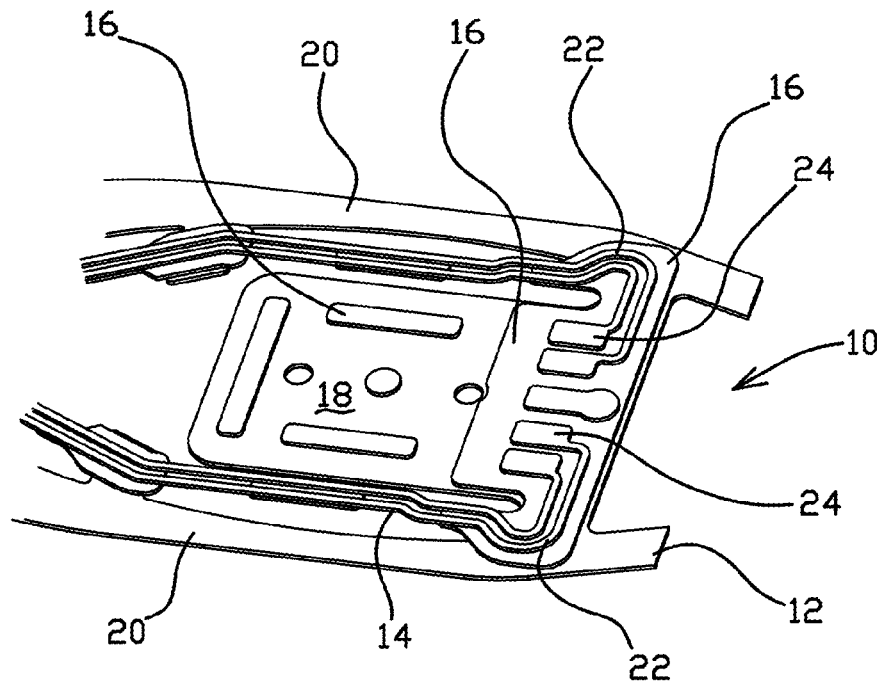
FIG. 1 is an isometric illustration of a first side of a portion of a first flexure on which electrical interconnects in accordance with the present invention can be fabricated.

Aspects of the present disclosure concern a reduced-size (e.g. diameter) interconnect. The ground feature and the region surrounding the ground feature can be covered by polymer covercoat material. Because the plated ground feature and surrounding region are covered by covercoat, design specifications, and in particular minimum and other size specifications, the interconnect can accommodate layer-to-layer misregistrations that may result in exposed stainless steel regions. Some embodiments of the disclosure include plated ground features with diameters smaller than the apertures in the insulating layer.

Some embodiments of the disclosure include a stainless steel or other spring metal layer and a plurality of copper or other conducive material traces. A layer of polyimide or other dielectric insulating material separates the traces from the stainless steel layer at locations other than those of the interconnects. An aperture extends through the dielectric layer at the interconnect. The interconnect can include a portion of the trace extending over edge portions of the insulating material aperture and into contact with the spring metal layer. An insulating or covercoat layer of dielectric insulating material such as polyimide can cover the area around the interconnect, including any exposed portion of the spring metal layer in the aperture that is not covered by the trace. The trace has a width at the interconnect that can be less than or equal to the diameter of the dielectric layer aperture in some embodiments. In some other embodiments, the width of the trace is equal to or larger than the diameter of the aperture at the interconnect. Irrespective of the relative widths and/or diameters of the traces and aperture, the process and other manufacturing specifications do not require that the width of the trace at the interconnect be large enough to cover the entire aperture given expected ranges of layer-to-layer misregistrations due to expected process variations. In other words, the width of the trace can be so narrow with respect to the diameter of the aperture that it is anticipated that portions of the spring metal layer may (but need not) be exposed at the interconnect location. The size of the covercoat layer over the interconnect is sufficiently large to cover the aperture in the insulating layer, given anticipated misregistrations due to process variations, and will thereby cover any exposed portions of the spring metal layer at the interconnect. Portions of the trace at the location of the interconnect may not be plated by corrosion resistant materials such as Au or Ni & Au. Other portions of the traces can be plated with corrosion resistant materials such as Au or Ni & Au. The trace layer portion of the interconnect can be formed at the same time (i.e., during the same process steps) as the trace being interconnected to the stainless steel layer. In other embodiments the plated conductor layer portion of the interconnect can be formed separately from the trace.

Portions of the trace at the location of the interconnect (e.g., portions covered by the covercoat) may not plated by corrosion resistant materials such as Au or Ni & Au. In some embodiments, portions of the trace can have coatings, such as electroless Ni, that can be deposited on the trace without being deposited on the spring metal layer. Other portions of the traces can be plated with corrosion resistant materials such as Au or Ni & Au. Besides corrosion resistance, the plating layer can facilitate an electrical connection (solder, ultrasonic bonding, conductive resin, etc.) to other hard disk drive components and allow for low resistance electrical probing.

Another embodiment includes an enlarged-diameter plated interconnect portion having a diameter larger than the adjacent trace portion at the interconnect. The enlarged-diameter plated region, which can be the same material as the trace or other conductive material such as nickel, can have a diameter that is smaller than, equal to, or larger than the diameter of the aperture in the insulating layer. Like the embodiment described above, the diameter of the plated region can be so narrow with respect to the diameter of the aperture that it is anticipated that portions of the spring metal layer may (but need not) be exposed at the interconnect location. The size of the covercoat layer over the interconnect is sufficiently large to cover the aperture in the insulating layer, given anticipated misregistrations due to process variations, and will thereby cover any exposed portions of the spring metal layer at the interconnect.

Other embodiments of the disclosure include at least one trace adjacent to the interconnect. The trace is separated from the interconnect by a minimum distance that is sufficient to accommodate anticipated misregistrations due to process variations and to prevent the trace from extending into the aperture of the interconnect. The covercoat layer over the interconnect can extend over portions of the adjacent trace. At interconnect locations within the region of the covercoat, specifications for the sizes of the trace and aperture do not need margins to account for anticipated layer-to-layer misregistration. At locations spaced from the covercoat layer-covered portions of the interconnect, conventional or otherwise known margins can be used to account for anticipated misregistration.

In some embodiments of the invention the width of the interconnect is about 15 μm and the diameter of the aperture is about 20 μm. An adjacent trace can be about 25 μm from the edge of the aperture. Other embodiments of the invention include larger and smaller apertures, traces and trace spacings.

DETAILED DESCRIPTION OF THE INVENTION

Figure 2:
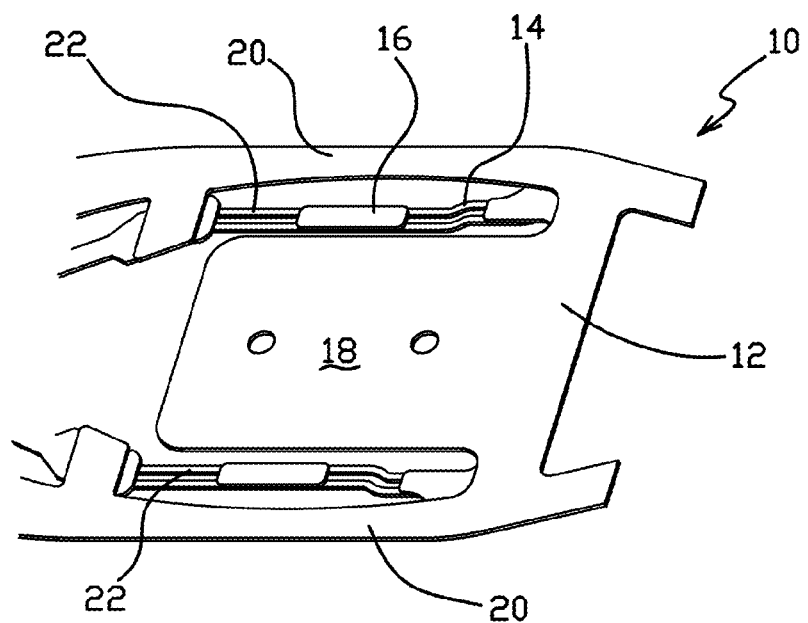
FIG. 2 is an isometric illustration of a second side of the portion of the flexure shown in FIG. 1.

FIGS. 1 and 2 are illustrations of the opposite sides of a portion of a wireless or integrated lead flexure 10 (i.e., a suspension component) on which interconnects in accordance with the present invention can be fabricated. The "lead" or "copper" side of the flexure is shown in FIG. 1, and the "stainless steel" side is shown in FIG. 2. The flexure 10 can be formed from a laminated sheet of material including a spring metal layer 12 and a conductor layer 14 separated by a dielectric layer 16. The spring metal layer, which is typically stainless steel (a conductive material), is formed into structural portions such as a tongue 18 and side spring arms 20. The conductor layer 14, which can be copper or a copper alloy, is formed into a number of integrated traces 22 (e.g., as leads). Traces 22 terminate at the end of the tongue 18 at bond pads 24. Portions of the dielectric layer 16 are also removed, but generally remain at locations where the traces 22 overlay the spring metal layer 12. Flexures such as 10 are generally known and commercially available from a number of manufacturers including Hutchinson Technology Incorporated of Hutchinson, Minn. The flexure 10 can be manufactured from a laminated sheet of material using conventional or otherwise known photolithography and etching processes. However, the interconnects in accordance with the invention can be incorporated into other types of suspensions and suspension components, including those manufactured by other processes.

At various locations, electrical connections can be made between the traces 22 and the spring metal layer 12. For example, the spring metal layer 12 can provide an electrical grounding connection for one or more of the traces 22 at one or more interconnects. Such interconnects can establish electrical connections through the dielectric layer 16, as further discussed herein.

FIGS. 3A-B show some aspects of prior art interconnects. Specifically, FIG. 3A shows a cross sectional view of an interconnect 300. As shown in FIG. 3A, a dielectric layer 322 extends over a spring metal layer 320. The dielectric layer 322 can electrically separate an electrical trace of flexure supported by the spring metal layer 320. However, an aperture 340 in the dielectric layer 322 exposes a portion of the spring metal layer 320 to allow for an electrical connection with the spring metal layer 320. Trace layer 326 is disposed within the aperture 340 to make contact with the spring metal layer 320 and establish an electrical connection between a circuit of the flexure and the spring metal layer 320. A covercoat layer 324 can be provided over the trace layer 326 and the dielectric layer 322, as shown.

In prior art embodiments, the entire surface of the spring metal layer 320 within the aperture 340 is covered by the trace layer 326. Specifically, in the embodiment of FIG. 3A, the width 330 of the aperture 340 is 0.070 millimeters while the width 332 of the trace layer 326 is 0.120 millimeters, such that the trace layer 326 fully spans over the aperture 340 and continues laterally over the dielectric layer 322.

The relatively large size of the trace layer 326 is further accounted for by a design requirement to fully cover the aperture 340 with the trace layer 326 despite misregistration. The automated technique for forming the aperture 340 and the trace layer 326 may be expected to laterally deviate from targeted locations within a margin of error. Misregistration, as used herein, refers to the difference between the actual placement of an element from the targeted placement. The trace layer 326 has a width 332 that is significantly greater than the width 330 of the aperture 340 to ensure that even if the trace layer 326 is deposited laterally offset from targeted center alignment with the aperture 340 by an amount within an expected margin of error, the aperture 340 will still be entirely covered by the trace layer 326 such that the spring metal layer 320 is not exposed within the aperture 340. The covercoat layer 324 can have a width 334 larger than the width 332 of the trace layer 326 to provide further margin to accommodate misregistrations of the trace layer 326 and/or the covercoat layer 324. Likewise, the dielectric layer 322 can have a width 336 larger than the width 332 of the trace layer 326 to provide further margin to accommodate lateral misregistrations of the trace layer 326. The expanded width 332 of the trace layer 326 to ensure complete coverage over the width 330 of the aperture 340 increases the overall footprint of the interconnect 300. FIG. 3B illustrates an overhead view taken by an electron microscope of a trace extending over, and completely covering, an aperture in a dielectric layer, consistent with the illustrated embodiment of FIG. 3A. The covercoat layer 324 is not shown in FIG. 3B.

Figure 4A:
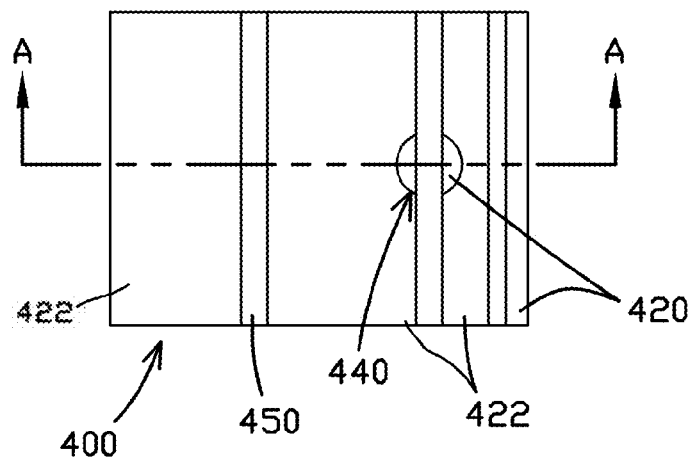
FIG. 4A is an overhead view of an interconnect of a head suspension in accordance with various embodiments of the present invention.
Figure 4B:
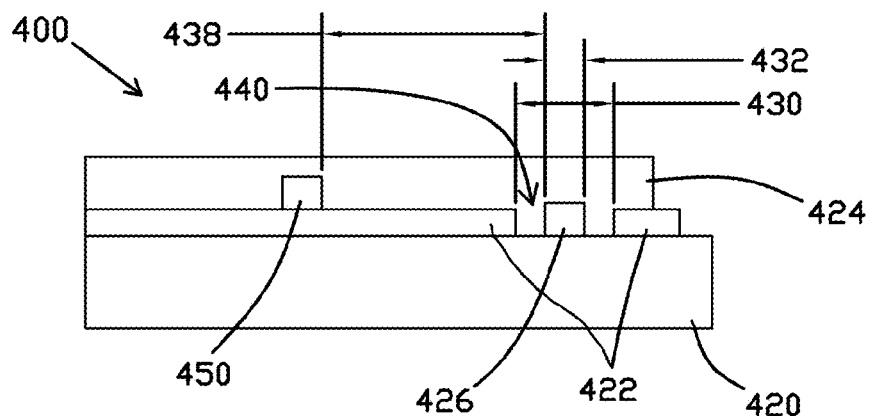
FIG. 4B is cross sectional view of the interconnect of FIG. 4A.

FIG. 4A illustrates an overhead view of an interconnect 400 while FIG. 4B illustrates a corresponding cross sectional view of the interconnect 400. The interconnect 400 makes a mechanical and an electrical connection between the trace layer 426 and the metal spring layer 420. The metal spring layer 420 can be configured as any metal spring layer referenced herein. For example, the metal spring layer 420 can be constructed of stainless steel, the metal spring layer 420 can provide a substantial majority of the mechanical support for a head suspension, the metal spring layer 420 can serve as a mounting support for flexure, and the metal spring layer 420 can serve as an electrical ground. The metal spring layer 420 can comprise a first side and a second side. The first side can correspond to a top side and the second side can correspond to a bottom side of the metal spring layer 420. The trace layer 426 can be formed from a conductive metal such as copper. The trace layer 426 can be part of an electrical circuit for powering one or more read/write transducers or other energy supplying or consuming components of a memory storage drive.

A covercoat layer 424 is shown in FIG. 4B but is not shown in FIG. 4A in order to show other components which would otherwise be partially or fully obscured by the covercoat layer 424. A dielectric layer 422 is provided over the metal spring layer 420 and, except for the aperture 440, is between, and electrically separates, the metal spring layer 420 and the trace layer 426. The dielectric layer 422 has a first side and a second side. The first side can correspond to a top side and the second side can correspond to a bottom side of the dielectric layer 422. The second side of the dielectric layer 422 is disposed on the first side (i.e. the top side) of the metal spring layer 420. The aperture 440 is a void in the dielectric layer 422 that extends from the first side to the second side of the dielectric layer 422. The aperture 440 allows the trace layer 426 to contact the metal spring layer 420 through the dielectric layer 422 to provide an electrical ground for the trace layer 426 to the metal spring layer 420. The aperture 440 is shown as a circle in FIG. 4A, however the aperture 440 can alternatively be a square, rectangle, oval, or other shape.

As shown in FIGS. 4A-B, a portion of the first side of the spring metal layer 420 is exposed through the aperture 440 (disregarding the covercoat layer 424). The portion of the metal spring layer 420 is exposed through the aperture 440 because the aperture 440 is not entirely covered by the trace layer 426. As shown, the width 432 of the trace layer 426 is less than the width 430 of the aperture 440, such that the portion of the metal spring layer 420 exposed through the dielectric layer 422. In some embodiments, the width 432 of the trace layer 426 is equal to the width 430 of the aperture 440. Even in embodiments where the width 432 of the trace layer 426 is the equal to the width 430 of the aperture 440, expected misregistration in the placement of the trace layer 426 relative to the aperture 440 can allow a portion of the metal spring layer 420 to not be covered by the trace layer 426 and expose a portion of the spring metal layer 420 through the aperture 440.

As discussed herein, the trace layer 426 is susceptible to corrosion. A first option to resist corrosion of the trace layer 426 is to plate the trace layer 426. The trace layer 426 can be plated with Au, Ni & Au, and/or other metal. A second option is to coat the trace layer 426 with a polymer, such as polyimide. The covercoat layer 424 can be a polymer coating. It will be understood that only a small portion of the trace layer 426 is shown in FIGS. 4A-B and that the trace layer 426 extends along the first side (i.e. top surface) of the dielectric layer 422 to other portions of a head suspension. The covercoat layer 424 can be placed over a majority of the trace layer 426 (including those portions not shown in FIG. 4A) while the uncoated portions can be plated with Au or Ni & Au to protect the entirely of the trace layer 426 from corrosion. The use of plating instead of the covercoat layer 424 can be useful in areas where a terminal connection is to be made to the trace layer 426. However, such Au or Ni & Au plating may not be desired along the interconnect 400 because gold does not typically bond well with the stainless steel of the metal spring layer 420. Therefore, at least the portion of the trace layer 426 within the aperture 440 may not be plated with a corrosion resisting metal. As such, the covercoat layer 424 extends over the trace layer 426 along the aperture 440, as shown in FIG. 4B. In some embodiments, the corrosion resisting plating can be generally applied to the trace layer 426 but the plating can be selectively removed from the section of the trace layer 426 that extends, or is planned to extend, along the aperture 440. In some alternative embodiments, the corrosion resisting plating can be generally applied to the trace layer 426 but may not be applied to the section of the trace layer 426 that extends, or is planned to extend, along the aperture 440. In either case, a section of the trace layer 426 within the aperture 440 can be unplated such that the copper (or other base substrate metal) of the trace layer 426 is exposed within aperture 440. The unplated and exposed copper (or other base substrate metal) of the trace layer 426 can be protected from corrosion by application of the covercoat layer 424 over the aperture 440 as shown. The covercoat layer 424 can extend laterally beyond the aperture 440 to account for expected misregistration of the elements, as discussed herein.

The width 432 of the trace layer 426 can be about 5 µm or greater. In some embodiments, the width 432 of the trace layer 426 can be about 15 µm. In some embodiments, the width 432 of the trace layer 426 can be about 5-15 µm. Other dimensions are also contemplated.

The width 430 of the aperture 440 can be about 35 µm, or greater in some other embodiments. In some embodiments, the aperture 440 can be based on the thickness of the dielectric layer 422 (i.e. the distance from the first side of the aperture 440 to the second side of the aperture 440). For example, the width 430 of the aperture 440 can be about half the thickness of the dielectric layer 422 or greater. In some embodiments, the width 430 of the aperture 440 is about 35 µm or greater. Different dimensions of the elements of the interconnect 400 can be used based on expected misregistration of the elements to ensure that the trace layer 426 is still placed such that at least a portion of the trace layer 426 contacts the metal spring layer 420 within the aperture 440. The intended placement of the trace layer 426 within the aperture 440 can be center aligned, wherein the center of the trace layer 426 is targeted to align with the center of the aperture 440. However, it may be known that a particular level of misregistration, in this case misalignment between the center of the trace layer 426 and the center of the aperture 440, is to be expected based on the equipment and techniques used. As such, the widths of the elements can be based on the expected misregistration of the elements to ensure that trace layer 426 contacts the metal spring layer 420 through the aperture 440, even if some of metal spring layer 420 is not covered by the trace layer 426 through the aperture 440. In some cases, the width 430 of the aperture 440 can set as a function of the width 432 of the trace layer 426 and the registration margin. For example, the width 430 of the aperture 440 can be based on the following equation:

$$VW \geq 2*(RM+FM)-TW$$

wherein VW=aperture 440 width 430; RM=registration margin; FM=functional PGF conductor minimum; and TW=trace layer 426 width 432. RM refers to the minimum design distance required to account for process variation resulting from aligning two different layers. A RM value can determined by defining an acceptable process capability based on known tolerances, which is typically 3 to 6 times one standard deviation of measured process variation. In some examples, the RM can be 20-25 μm. RM+FM, or other misregistration metric, can alternatively be a total maximum misregistration that is additive between two or more placed elements. FM refers to the minimum contact area between the conductor layer and spring metal layer that is necessary to ensure a reliable electrical connection. The FM can be variable based on the type of materials used and can be determined through reliability testing. In some cases, FM may also be determined based on the maximum electrical resistance allowed by the design to meet performance requirements.

Furthermore, the relatively small width 432 of the trace layer 426 and the relatively small width 430 of the aperture 440 allows for closer placement of various other components. FIG. 4A-B show an adjacent trace 450 that extends parallel with the trace layer 426. The adjacent trace 450 can be placed with a separation distance 438 between the trace layer 426 and the adjacent trace 450. The separation distance 438 can prevent the adjacent trace 450 from being placed within the aperture 440, which would unintentionally ground the adjacent trace 450. The separation distance 438 can be measured from the closest edges of the respective conductors. The separation distance 438 can be about 15 μm. In some embodiments, the separation distance 438 is about 15 μm or greater. In some cases, the separation distance 438 can set as a function of the width 432 of the trace layer 426, the width 430 of the aperture 440, and the registration margin. For example, the separation distance 438 (AT) can be based on the following equation:

$$AT \geq (VW/2)-(TW/2)+RM$$

TW refers to the trace layer 426 width 432. In the cases, the RM function used in the above equation can specifically refer to the registration margin of the dielectric layer 422. Another measure of the grounding configuration is the distance from the centerline of the trace layer 426 to the edge of the covercoat layer 424. In some embodiments, the distance from the centerline of the trace layer 426 to the edge of the covercoat layer 424 can be set as a function of the trace layer 426 width 432 and the registration margin. For example, the distance from the centerline of the trace layer 426 to the edge of the covercoat layer 424 can be greater than or equal to half of the trace layer 426 width 432 plus the registration margin. In some other embodiments, the distance from the centerline of the trace layer 426 to the edge of the covercoat layer 424 (DE) can be greater than or equal to half of the aperture 440 width 430 plus the registration margin. The distance from the centerline of the trace layer 426 to the edge of the dielectric layer 422 can be greater than or equal to DE plus an edge registration margin. The edge registration margin can be about 15 μm, in some embodiments.

Conventional or otherwise known additive trace suspension assembly (TSA+) photolithography, deposition and wet and dry etching processes can be used to fabricate the ground features of the invention. For example, the void of the aperture 440 can be formed by removing material (e.g., via etching) from the dielectric layer 422. The aperture 440 can be etched through the dielectric layer 422 to expose the metal spring layer 420 at the location of the interconnect 400. Trace layer 426 can be formed separately and then placed on the dielectric layer 422 and/or can be formed by building up (e.g., by electroplating). For example, the trace layer 426 can be built up from a seed layer deposited on the stainless steel surface of the metal spring layer 420 within the aperture 440. The seed layer can comprise CrCu.

Figure 4C:
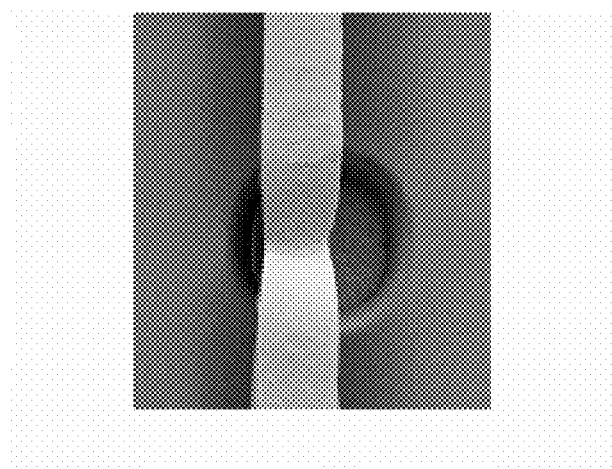
FIG. 4C is an image taken by an electron microscope of an interconnect of a head suspension in accordance with various embodiments of the present invention.

FIG. 4C illustrates an electron microscope image of a conductor extending into an aperture to connect with a stainless steel layer, the aperture formed within a dielectric layer overtop the stainless steel layer. As shown, the width of the conductor is less than the width of the aperture. Portions of the stainless steel spring layer are exposed through the aperture on opposing lateral sides of the trace layer.

Figure 5A:
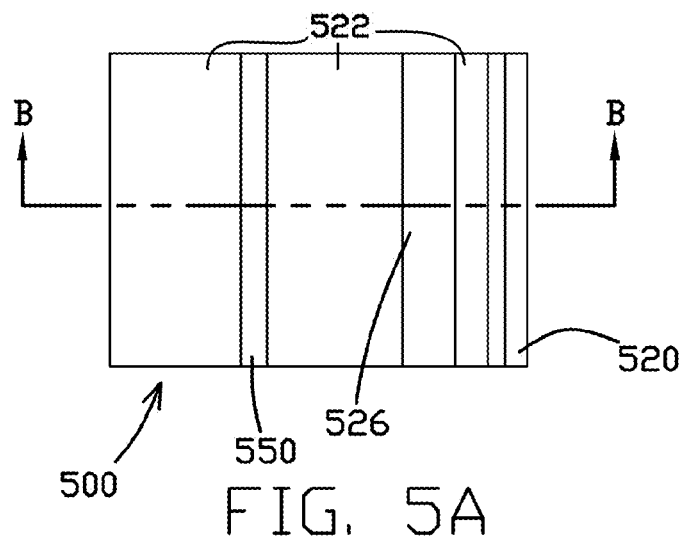
FIG. 5A is an overhead view of an interconnect of a head suspension in accordance with various embodiments of the present invention.

FIG. 5A illustrates an overhead view of an interconnect 500. The interconnect 500 makes a mechanical and an electrical connection between the trace layer 526 and the metal spring layer 520. The metal spring layer 520 can be configured as any metal spring layer referenced herein. The trace layer 526 can be configured as any conductor referenced herein (e.g., a copper trace). The trace layer 526 can be part of an electrical circuit for powering one or more read/write transducers or other components of a memory storage drive.

Figure 5B:
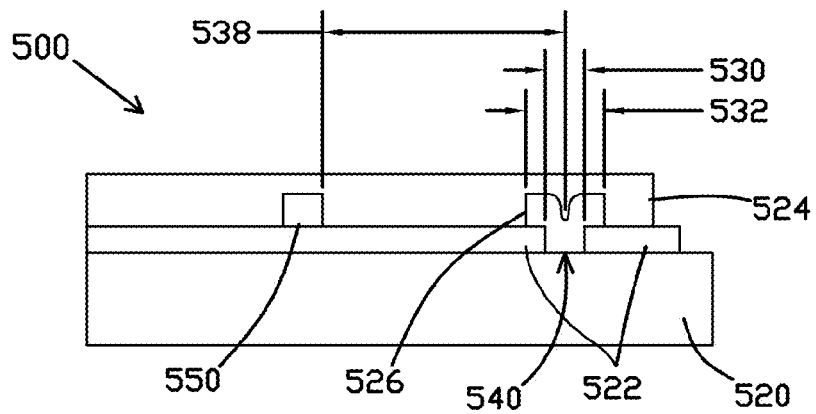
FIG. 5B is cross sectional view of the interconnect of FIG. 5A.

The covercoat layer 524 is shown in FIG. 5B but is not shown in FIG. 5A in order to show other components in FIG. 5A which would otherwise be partially or fully under the covercoat layer 524. The metal spring layer 520 can comprise a first side and a second side. The first side can correspond to a top side and the second side can correspond to a bottom side of the metal spring layer 520. A dielectric layer 522 is provided over the metal spring layer 520 and, except for the aperture 540, is between, and electrically separates, the metal spring layer 520 and the trace layer 526. The dielectric layer 522 has a first side and a second side. The first side can correspond to a top side and the second side can correspond to a bottom side of the dielectric layer 522. The second side of the dielectric layer 522 is disposed on the first side (i.e. the top side) of the metal spring layer 520. The aperture 540 is a void in the dielectric layer 522 that extends from the first side to the second side of the dielectric layer 522. The aperture 540 in the dielectric layer 522 allows the trace layer 526 to contact the metal spring layer 520 to provide an electrical ground for the trace layer 526 to the metal spring layer 520. The aperture 540 is shown as a circle in FIG. 5A, however the aperture 540 can alternatively be a square, rectangle, oval, or other shape.

While the width 532 of the trace layer 526 is greater than the width 530 of the aperture 540 (unlike in the embodiment of FIGS. 4A-B), the width 530 of the aperture 540 and the width 532 of the trace layer 526 are still generally smaller than conventional interconnects. As with the embodiment of FIGS. 4A-B, the trace layer 526 can be plated with a corrosion resistant plating (e.g., Au or Ni & Au) except for a portion of the trace layer 526 that is proximate and/or within the aperture 540. With the plating absent, the trace layer 526 can make a reliable connection with the metal spring layer 520 through the aperture 540. Moreover, the width 532 of the trace layer 526 can allow some degree of misregistration.

The width 532 of the trace layer 526 can be about 40 μm while the width 530 of the aperture 540 can be about 20 μm, however other dimensions are possible. Different dimensions of the elements of the interconnect 500 can be used based on one or more relationships to the expected misregistration of the elements to ensure that the trace layer 526 is still placed such that at least a portion of the trace layer 526 contacts the metal spring layer 520 within the aperture 540. The intended placement of the trace layer 526 within the aperture 540 can be center aligned, wherein the center of the trace layer 526 is targeted to align with the center of the aperture 540. However, it may be known that a particular level of misregistration, in this case misalignment between the center of the trace and the center of the aperture 540, is to be expected based on the equipment and techniques used. As such, the widths of the elements can be based on the expected misregistration of the elements to ensure that trace layer 526 contacts the metal spring layer 520 through the aperture 540, even if some of metal spring layer 520 is not covered by the trace layer 526 through the aperture 540.

Even through the width 532 of the trace layer 526 is greater than or equal to the width 530 of the aperture 540 in FIG. 5B, the dimensional equations presented in connection with FIG. 4B can be applicable to the dimensions of the embodiment of FIG. 5B. For example, the separation distance 538 can be calculated similarly to the separation distance 438.

The width 532 of the trace layer 526 and the width 530 of the aperture 540 are each considerably smaller than the width 330 of the aperture 340 and the width 332 of the trace layer 326 of the embodiment of FIGS. 2A-B. The relatively small width 532 of the trace layer 526 and the relatively small width 530 of the aperture 540 can allow other components to be smaller to accommodate another parts or closer proximity. For example, the separation distance 538 between the edge of the adjacent conductor 550 and the center of the trace layer 526 and/or aperture 540 can be about 35 μm.

Figure 5C:
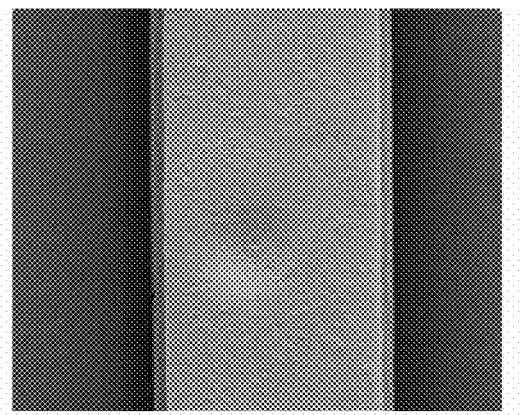
FIG. 5C is an image taken by an electron microscope of an interconnect of a head suspension in accordance with another embodiment of the present invention.

FIG. 5C illustrates an electron microscope image of a conductor extending into an aperture to connect with a stainless steel layer, the aperture formed within a dielectric layer overtop the stainless steel layer. As shown, the width of the conductor is greater than the width of the aperture. A dimple is shown in the conductor where the conductor extends into the aperture in the dielectric layer to make a connection with the stainless steel layer.

Although the present invention has been described with reference to preferred embodiments, those skilled in the art will recognize that changes can be made in form and detail without departing from the spirit and scope of the invention.

The following is claimed:

1. An electrical interconnect of a head suspension comprising:
    a spring metal layer, the spring metal layer electrically conductive, the spring metal layer having a first side and a second side opposite the first side;
    a dielectric layer having a first side and a second side opposite the first side, the second side of the dielectric layer disposed on the first side of the spring metal layer, the dielectric layer having an aperture between the first side and the second side of the dielectric layer, a portion of the first side of the spring metal layer exposed through the dielectric layer within the aperture; and
    a trace layer having a first section and a second section, the trace layer formed from an electrically conductive metal, the first section of the trace layer disposed on the first side of the dielectric layer, the second section of the trace layer extending into the aperture to mechanically and electrically connect with the portion of the first side of the spring metal layer, wherein part of the portion of the first side of the spring metal layer is not covered by the trace layer;
    corrosion inhibiting type metal plated on the first section of the trace layer, wherein the second section of the trace layer is not plated with the corrosion inhibiting type of metal; and
    a covercoat layer extending over the trace at the location of the aperture and covering the unplated second section of the trace layer, the covercoat comprising a polymer layer that inhibits corrosion of the trace layer.

2. The electrical interconnect of claim 1, wherein the electrical interconnect electrically grounds an electrical circuit of the trace layer to the spring metal layer.

3. The electrical interconnect of claim 1, wherein the width of the trace layer is less than the width of the aperture.

4. The electrical interconnect of claim 1, wherein the width of the trace layer is about 5-15 gm and the width of the aperture is about half the thickness of the dielectric layer or greater.

5. The electrical interconnect of claim 1, wherein the width of the trace layer is greater than the width of the aperture.

6. The electrical interconnect of claim 1, wherein the width of the trace layer is the same along the first section and the second section of the trace layer, and wherein the first section of the trace layer extends along the first side of the dielectric layer to electrically connect with an electrical consuming component supported on the metal spring layer.

7. The electrical interconnect of claim 1, wherein the aperture has a circular, square, or rectangular shape.

8. The electrical interconnect of claim 1, wherein the part of the portion of the first side of the spring metal layer that is not covered by the trace layer comprises a first part and a second part, and wherein the first part is located on the opposite side of the trace layer with respect to the second part.

9. The electrical interconnect of claim 1, further comprising a seed layer of plating disposed on the portion of the first side of the spring metal layer, the seed layer improving bonding between the trace layer and the spring metal layer.

10. A method for forming an electrical interconnect on a head suspension of the type having a spring metal layer, a dielectric layer, and a trace layer having a first section and a second section that are formed from an electrically conductive metal, the method comprising:
    disposing the dielectric layer along the spring metal layer, the dielectric layer having a first side and a second side, the dielectric layer disposed such that the second side of the dielectric layer is on the first side of the spring metal layer;
    forming an aperture between the first side and the second side of the dielectric layer, a portion of the first side of the spring metal layer exposed through the dielectric layer within the aperture; and
    disposing the trace layer over the first side of the dielectric layer such that the first section of the trace layer extends along the first side of the dielectric layer and the second section of the trace layer extends into the aperture to mechanically and electrically connect with the portion of the first side of the spring metal layer, wherein part of the portion of the first side of the spring metal layer is not covered by the trace layer;
    plating the first section of the trace layer with a corrosion inhibiting type of metal, and wherein the second section of the trace layer in the aperture is not plated with the corrosion inhibiting type of metal; and
    applying a covercoat layer over the second section of the trace layer and covering the unplated second section of the trace layer, the covercoat layer comprising a polymer layer that inhibits corrosion of the trace layer.

11. The method of claim 10, wherein the electrical interconnect electrically grounds an electrical circuit of the trace layer to the spring metal layer.

12. The method of claim 10, wherein the width of the trace layer is less than the width of the aperture.

13. The method of claim 10, wherein the width of the trace layer is equal to or greater than the width of the aperture and the portion of the first side of the spring metal layer is exposed due to misregistration.

14. The method of claim 10, wherein the width of the trace layer is the same along the first section and the second section of the trace layer.

15. The method of claim 10, wherein the aperture is formed by etching and the trace layer is disposed by building up the trace layer through electroplating.

16. A method for forming an electrical interconnect on a head suspension of the type having a spring metal layer, a dielectric layer, and a trace layer having a first section and a second section that are formed from an electrically conductive metal, the method comprising:
  disposing the dielectric layer along the spring metal layer, the dielectric layer having a first side and a second side, the dielectric layer disposed such that the second side of the dielectric layer is on the first side of the spring metal layer;
  forming an aperture between the first side and the second side of the dielectric layer, a portion of the first side of the spring metal layer exposed through the dielectric layer within the aperture, the aperture formed to have a first width; and
  disposing the trace layer over the first side of the dielectric layer such that the first section of the trace layer extends along the first side of the dielectric layer and the second section of the trace layer extends into the aperture to mechanically and electrically connect with the portion of the first side of the spring metal layer, the first section and the second section having a second width;
  plating the first section of the trace layer with a corrosion inhibiting type of metal, and wherein the second section of the trace layer in the aperture is not plated with the corrosion inhibiting type of metal; and
  applying a covercoat layer over the second section of the trace layer and covering the unplated second section of the trace layer, the covercoat layer comprising a polymer layer that inhibits corrosion of the trace layer;
  wherein the trace layer is targeted to be disposed to be centrally aligned with the aperture; and
  wherein the first width and the second width are set based on an expected lateral misregistration with respect to the aperture that permits some of the portion of the first side of the spring metal layer to not be covered by the trace layer.

* * * * *

UNITED STATES PATENT AND TRADEMARK OFFICE
CERTIFICATE OF CORRECTION

| | | |
|---|---|---|
| PATENT NO. | : 9,093,117 B2 | Page 1 of 1 |
| APPLICATION NO. | : 13/848544 | |
| DATED | : July 28, 2015 | |
| INVENTOR(S) | : Kyle T. Tobias | |

It is certified that error appears in the above-identified patent and that said Letters Patent is hereby corrected as shown below:

In the claims

Column 10, line 16, delete "gm" and insert therefor -- μm --.

Signed and Sealed this
Nineteenth Day of April, 2016

Michelle K. Lee
*Director of the United States Patent and Trademark Office*